United States Patent
Carbone et al.

(10) Patent No.: US 8,253,501 B2
(45) Date of Patent: Aug. 28, 2012

(54) DEVICE WITH TWO DIFFERENTIAL OSCILLATORS WITH PULSED POWER SUPPLY COUPLED TO AND IN QUADRATURE-PHASE WITH EACH OTHER

(75) Inventors: Adriano Carbone, Rome (IT); Fabrizio Palma, Rome (IT)

(73) Assignee: Universita Degli Studi di Roma "La Sapienza", Rome (IT)

( * ) Notice: Subject to any disclaimer, the term of this patent is extended or adjusted under 35 U.S.C. 154(b) by 134 days.

(21) Appl. No.: 12/518,811

(22) PCT Filed: Dec. 11, 2007

(86) PCT No.: PCT/IT2007/000863
§ 371 (c)(1),
(2), (4) Date: Oct. 19, 2009

(87) PCT Pub. No.: WO2008/072274
PCT Pub. Date: Jun. 19, 2008

(65) Prior Publication Data
US 2010/0085122 A1  Apr. 8, 2010

(30) Foreign Application Priority Data
Dec. 11, 2006 (IT) ............................. RM2006A0665

(51) Int. Cl.
H03B 5/12 (2006.01)
(52) U.S. Cl. ...................... 331/45; 331/117 FE; 331/167
(58) Field of Classification Search .................... 331/45, 331/117 FE, 167
See application file for complete search history.

(56) References Cited

U.S. PATENT DOCUMENTS
4,063,193 A   12/1977  Wilcox
(Continued)

FOREIGN PATENT DOCUMENTS
EP    0899866 A1    3/1999
(Continued)

OTHER PUBLICATIONS

D. B. Leeson, "A Simple Model of Feedback Oscillator Noise Spectrum", Proc. IEEE, v.54, Feb. 1966. pp. 329-330.
(Continued)

*Primary Examiner* — Robert Pascal
*Assistant Examiner* — James Goodley
(74) *Attorney, Agent, or Firm* — Roberts Mlotkowski Safran & Cole P.C.

(57) ABSTRACT

The present invention concerns a device having a first and a second differential oscillators (1, 2; 1'2') coupled to and in quadrature-phase with each other, comprising first and second resonant electronic means (L1, C1, C2; L2, C3, C4) respectively, which are apt to provide, respectively on first two and second two terminals (NODE_1, NODE_2; NODE_3, NODE 4), first two and second two oscillating signals ($V_{NODE\_1}$, $V_{NODE\_2}$; $V_{NODE\_3}$, $V_{NODE\_4}$), said first two oscillating signals ($V_{NODE\_1}$, $V_{NODE\_2}$) being in phase opposition to each other and in quadrature-phase with said second two oscillating signals ($V_{NODE\_3}$, $V_{NODE\_4}$), the device being characterised in that it comprises first generator electronic means (M13-M24) apt to detect first instants of passage through a first reference value of each one of said first oscillating signals ($V_{NODE\_1}$, $V_{NODE\_2}$) and to generate first power supply pulses for said second resonant electronic means (L2, C3, C4) in second instants, and in that it comprises second generator electronic means (M1-M12) apt to detect third instants of passage through a second reference value of each one of said second oscillating signals ($V_{NODE3}$, $V_{NODE\_4}$) and to generate second power supply pulses for said first resonant electronic means (L1, C1, C2) in fourth instants.

22 Claims, 3 Drawing Sheets

U.S. PATENT DOCUMENTS

| | | | |
|---|---|---|---|
| 5,955,929 | A | 9/1999 | Moon et al. |
| 6,542,043 | B1 | 4/2003 | Cao |
| 6,653,908 | B1 | 11/2003 | Jones |
| 2004/0085144 | A1 | 5/2004 | Wu et al. |
| 2006/0181356 | A1 | 8/2006 | Park et al. |
| 2009/0002084 | A1* | 1/2009 | Inoue et al. ............... 331/108 A |

FOREIGN PATENT DOCUMENTS

| IT | RM2004A000648 A1 | 3/2005 |
|---|---|---|
| WO | 0215400 | 2/2002 |
| WO | 2006070427 | 7/2006 |

OTHER PUBLICATIONS

R. Aparicio and Ali Hajimiri, "A CMOS Differential Noise-Shifting Colpitts VCO", Proceedings of the 2002 IEEE International Solid-State Circuits COnference, session 17, 17.2.

A. Hajimiri and T.H. Lee, "A General Theory of Phase Noise in Electrical Oscillators", IEEE Journal of Solid-State Circuits, vol. 33, No. 2, Feb. 1998, pp. 179-194.

A. Demir, A. Mehrotra and J. Roychowdhury, "Phase Noise in Oscillators: A Unifying Theory and Numerical Methods for Characterization", IEEE Transactions on Circuits and Systems-I, Fundamental Theory and Applications, vol. 47, No. 5, May 2000, pp. 655-674.

T.H. Lee, "The Design of CMOS Radio-Frequency Integrated Circuits", Cambridge University Press, 1998. pp. 488-500.

Pietro Andreani, Andrea Bonfanti, Luca Romano, Carlo Samori, "Analysis and Design of a 1.8-GHz CMOS LC Quadrature VCO", IEEE Journal of Solid-State Circuits, vol. 37, No. 12, Dec. 2002, pp. 1737-1747.

Behzad Razavi, "A Study of Injection Locking and Pulling in Oscillators", IEEE Journal of Solid-State Circuits, vol. 39, No. 9, Sep. 2004, pp. 1415-1424.

S. Perticaroli, N. Luli, F. Palma, "Derivation of Floquet Eigenvectors Displacement for Optimal design of LC Tank Pulsed Bias Oscillators", Scientific Research Journal, Circuits and Systems, pp. 311-319, vol. 2 No. 4, 2011, DOI: 10.4236/cs.2011.24043.

F. Palma, S. Perticaroli, "Floquet Eigenvectors Theory of Pulsed Bias Phase and Quadrature Harmonic Oscillators", Scientific Research Journal, Circuits and Systems, pp. 72-81, vol. 3, No. 1, 2012, DOI: 10.4236/cs.2012.31010.

EPO Communication in corresponding EPO Application No. 07866795.3 dated Jan. 13, 2012.

International Preliminary Report on Patentability in corresponding PCT Application No. PCT/IT2007/000863 dated Jan. 29, 2009.

\* cited by examiner

DEVICE WITH TWO DIFFERENTIAL OSCILLATORS WITH PULSED POWER SUPPLY COUPLED TO AND IN QUADRATURE-PHASE WITH EACH OTHER

CROSS REFERENCE TO RELATED APPLICATIONS

The present Application is a US national phase of PCT/IT2007/000863 filed on Dec. 11, 2007("PCT Application"), which claims priority from Italian Application No. RM2006A000665 filed on Dec. 11, 2006, both of which are hereby incorporated by reference in their entirety into the present Application.

The present invention relates to a device having two differential oscillators with pulsed power supply coupled to and in quadrature-phase with each other that has a substantially neglectable phase noise and a high power supply noise rejection, being simple, reliable, efficient, precise, and capable to generate quadrature oscillating signals even at high frequencies, also entailing a reduced power consumption. The device according to the invention is further usable in very many applications wherein the generation of quadrature oscillating signals is required.

In the following of the description, specific reference will be made to the application of oscillators to the telecommunication field, but it should be understood that the device (and the related driving process) according to the invention may be applied to any field when a generator of oscillating signals is required.

It is known that reduction of manufacture costs and applicability to a wide market of the modern mobile telecommunication network has been rendered possible thanks to the microelectronic circuit manufacture.

The typical example is the mobile or cellular telephone, where the whole communication system is substantially made in a single chip. The microelectronic manufacture has imposed a series of design constraints and it has created manufacturing problems which, in turn, have had the benefit to spur the scientific and technological search for the solution thereof.

Presently, the modern mobile systems use a variety of transmission interfaces, including GSM (Global System for Mobile Access), TDMA (Time Division Multiple Access) and CDMA (Code Division Multiple Access). In these systems a low noise local oscillator is required. A low noise local oscillator in optical receivers is similarly necessary.

Voltage controlled oscillators or VCOs represent a decisive element for making synthesised signal generators through their use in Phase Locked Loops or PLLs. In these devices a reference generator, generally a quartz crystal oscillator with oscillation frequency considerably lower than of the VCO, controls the precision of it through the comparison of the two relative phases and through the generation of an error signal that modifies the VCO frequency, correcting possible deviations.

U.S. Pat. No. 4,063,193 discloses a differential oscillator, comprising a parallel resonant circuit, that is power supplied in a differential way by two transistors, wherein a current generator supplies power in alternate way to the two ends of the resonant circuit.

Many implementations of this circuit exist, in particular with active loads, and implementations with both MOS and bipolar transistors have been presented.

The differential one is certainly the configuration more used in integrated circuits. In this regard, the differential architecture represents the basis for making VCO oscillators, since the differential connection of the oscillating circuit easily allow the addition, in parallel to the resonant circuit, of the series of two equal variable, voltage controlled, capacitors: for the existing symmetry, the central node between the two capacitors is devoid of differential signal and it may hence be connected to a control voltage, capable to modify the capacitance of a diode or MOS, thus allowing the oscillator frequency to be controlled.

U.S. Pat. No. 5,955,929 discloses a differential VCO oscillator including a cascade of delay cells, each one comprising a compensation circuit, that adjusts the capacitance thereof, and a reference current source.

U.S. Pat. No. 6,542,043 discloses a voltage controlled differential oscillator comprising a resonant LC circuit, including a pair of variable capacitance components and an inductor, provided with a central node connected to the circuit ground through an adjustable resistor.

U.S. Pat. No. 6,653,908 discloses a differential oscillator generating an oscillating signal the amplitude of which is automatically controlled through a current source in turn controlled by a negative peak detector and a positive peak detector.

US Patent Application No. US2004085144 discloses a VCO oscillator made as differential oscillator having a parallel LC resonant circuit that comprises a pair of variable capacitance diodes or varactors parallel connected to an inductor.

In spite of the control and correction mechanism with which a Vco is provided, the synthesised source is not ideal: random frequency variations around the nominal value are present. These variations constitute an enlargement of the source spectrum. The portion of spectrum ranging from tens of KHz up to some MHz from the carrier is generally the one of greatest interest for telecommunication. The presence of phase noise in this band entails a mixing among close channels in many wireless applications (such as for instance GSM and WLAN).

In this interval the correction of the PLL circuit is limited, sometimes greatly, by the band of the feedback loop, that in turn is limited for stability problems. The VCO noise is hence determining in the final characteristics of the system.

Unwanted variations of frequency (and phase) of the VCO may have various origins. A first source of alteration of the oscillator evolution is due to the noise present in the electronic circuits, in particular in the parasitic resistances of the reactive components of the resonant circuit representing the oscillator time reference, partly in the circuits which must periodically supply the resonant circuit with the energy lost during the oscillation just because the parasitic resistances.

To this phenomenon, usually defined as phase noise, the possibility of deviations, due to the interaction with the rest of the circuits within the integrated circuit wherein the oscillator is contained, adds. The phenomenon of frequency variation, called VCO pull-in, is of particular relevance, which is related to the effects on the oscillator by sudden variations of the power supply voltage due to, e.g., sudden power up or power down of adjacent circuit portions with high current loads, in particular of output circuits of the transmitter part, normally integrated within the same circuit for the reasons of savings.

Consequently, the possibility to design VCO with low phase noise is of particular interest in developing integrated circuits for telecommunication.

European Patent Application No. EP 0 899 866 A discloses an oscillator including a differential amplifier having resonant means power supplied by a current source, to which MOSFET varactors are coupled, wherein the capacitance of varactors, and thus the oscillation frequency, is controlled through a regulating voltage applied to a node common to the MOSFET varactors.

European Patent Application No. EP 0 899 866 A discloses an oscillator having resonant means and an active stage electrically connected to and injecting power into the same resonant means only in instants when the oscillating output signal is at maximum.

However, no one of the oscillators available nowadays, among the previously mentioned ones, has a low phase noise, though some of them have rather complex circuit architectures.

Italian Patent Application No. RM2004A000648 and corresponding PCT International Application No. WO2006/070427 of the present Applicant, herein incorporated by reference, disclose an efficient device including a single differential oscillator with pulsed power supply having a substantially neglectable phase noise and a high power supply noise rejection.

Such Applications are based on the fact that each process of supplying the energy lost by the oscillating circuit is accompanied by random processes which render partly unpredictable the amount of re-introduced energy. As stated for instance by D. B. Leeson in "*A Simple Model of Feedback Oscillator Noise Spectrum*", Proc. IEEE, v. 54, February 1966, pp. 329-30, the theory on phase noise is unanimous in indicating that this uncertainty reflects an uncertainty on the oscillator phase, it induces random frequency variations, and it hence generates an enlargement of its spectral distribution.

As described by A. Hajimiri and T. H. Lee in "*A general theory of phase noise in electrical oscillators*", IEEE Journal of Solid-State Circuits, vol. 33, p. 179-194, 1998, and by A. Demir, A. Mehrotra and J. Roychowdhury in "*Phase noise in oscillators: a unifying theory and numerical methods for characterization*", IEEE Transactions on Circuits and Systems-I, Fundamental Theory and Applications, Vol. 47, p. 655, 2000, the effect of noise related to the processes of "recharging" the state variables of the oscillator has not always the same effect on the phase noise, instead they present a stationary cyclic behaviour: depending on the specific portion of the period at which they are applied, their effect is either greater or smaller, and sometimes it is completely null.

This concept has been already expressed in literature, in particular for explaining, from the point of view of the phase noise, the characteristics of one of the most famous configurations of oscillator, the Colpitts one, as described by T. H. Lee in "The Design of CMOS Radio-Frequency Integrated Circuits", Cambridge University Press, 1998, p. 488. Afterwards, the Colpitts oscillator architecture has been extended to a configuration of differential type, as described by R. Aparicio and Ali Hajimiri in "A COS Differential Noise-Shifting Colpitts VCO", Proceedings of the 2002 IEEE International Solid-State Circuits Conference, session 17, 17.2. Both the original configuration of the Colpitts oscillator and the differential type version thereof present a dc power supply, that introduces noise towards the resonant circuit for the whole oscillation period. The pulse produced by the transistors, that is necessary for maintaining the oscillation, introduces further noise that adds to that caused by the biasing generator.

As described by the aforementioned article by A. Demir et al., the time-varying behaviour of the oscillator may be defined through particular eigenvectors, called Floquet eigenvectors, defined within the space of state variables. In particular the projections of the noise onto the first of these eigenvectors (i.e., the eigenvector with eigenvalue equal to 1, also indicated as "the first eigenvector") actually reflect on the phase noise.

Starting from this, the inventor of Applications No. RM2004A000648 and No. WO2006/070427 has developed a circuit architecture with a single differential oscillator that provides energy to the resonant circuit only in some properly selected instants of the period, significantly reducing both the phase noise, due to the energy supply to the resonant circuit, and the noise effects on the power supply. Such circuit architectures allows the resonant circuit to be connected to the power supply circuit that has to supply the energy lost during the oscillation thereto, only in periodical time intervals, which intervals represent a reduced portion of the oscillator period. In other words, the circuit architecture of the differential oscillator according to such Applications provides to the resonant circuit the energy necessary to the oscillation in particular moments of the period, at which the influence on the phase noise is minimum.

Among several types of power supply proposed in Applications No RM2004A000648 and No WO2006/070427, FIGS. 1-4 of such Applications refer to a power supply by current pulses, which are applied to a parallel resonant circuit. In this case the pulse is ideally applied in correspondence with the maximum of voltage across resonant circuit.

Pulses are generated by a proper generating circuit. In particular, among the two architectures for the pulse generating circuit proposed in Applications No. RM2004A000648 and No. WO2006/070427, FIGS. 2 and 3 thereof refer to a circuit detecting passage of the waveform generated by the resonant circuit through zero, when reference is made to the differential signal, or through the mean value, when reference is made to the signal oscillating with respect to the circuit ground ("single-ended" signal), and in correspondence with the passage through this threshold, i.e. zero or the mean value of the signal generated by the resonant circuit, power supply pulses are formed. Pulses are then suitably distributed depending on the specific power supply architecture.

However, as said before, Applications No. RM2004A000648 and No. WO2006/070427 disclose a circuit architecture exclusively having a single differential oscillator.

Presently, quadrature oscillators are commonly used in modern communications: both radio-mobile and wireless-LAN communications, in particular for digital-type transmissions. In fact, capacity of transmission may be increased by exploiting orthogonality properties of the sinusoidal carrier, transmitting information on two components in quadrature phase. Information recovery occurs through beating with still quadrature oscillators and successive integration. Precision of orthogonality between sinusoidal functions, both in transmitter and receiver, is an extremely critical parameter since an error causes intermodulation between the information content of the in-phase channel with the quadrature one.

Figure 1:
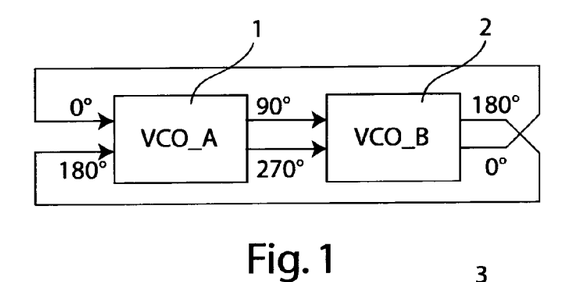
FIG. 1 schematically shows the circuit architecture of an in-phase/quadrature oscillator according to the prior art.

Due to the importance of this topic, a very extensive literature on in-phase/quadrature oscillators exists. As described by Pietro Andreani, Andrea Bonfanti, Luca Romanò, and Carlo Samori in "*Analysis and Design of a* 1.8-*GHz CMOS LC Quadrature VCO*", IEEE Journal of Solid-State Circuits, Vol. 37, No. 12, pp. 1737-1747, December 2002, and as schematically illustrated in FIG. 1, the base concept of the prior art in-phase/quadrature oscillators consists in coupling the two oscillators, respectively 1 and 2, which form a positive feedback chain. Oscillation constraints impose on each one of the two oscillators 1 and 2 departure from the resonance frequency, whereby the phase difference between voltage across the resonator and power supply current is ideally null, for reaching a condition with π/2 phase displacement in each one of the two oscillators.

However, such prior art in-phase/quadrature oscillators suffer from some drawbacks, mainly due to the need of reaching such phase displacement condition.

First of all, reaching such condition requires departure from the resonance frequency with consequent reduction of the phase sensitivity coefficient, or, equivalently, of the resonator quality coefficient. This entails a deterioration of the oscillator phase noise.

Moreover, subdivision of the whole phase displacement of π radians between the two oscillators is symmetrical only on the basis of the similarity between the two implementations of the oscillators; probable dissymetries lead to phases different from π/2.

It is therefore an object of the present invention to provide a device generating quadrature oscillating signals that has a substantially neglectable phase noise, being simple, reliable, efficient, and precise.

It is still an object of the present invention to provide such a generator device having a high power supply noise rejection.

It is a further object of the present invention to provide such a device using a simple circuit architecture, that may be easily added in an integrated circuit without significant increase of dissipated power.

It is a further object of the present invention to provide such a device that is apt to accurately generate in quadrature-phase oscillating signals even at high frequencies.

It is therefore specific subject matter of the present invention a device having a first and a second differential oscillators coupled to and in quadrature-phase with each other, comprising first and second resonant electronic means respectively, which are apt to provide, respectively on first two and second two terminals, first two and second two oscillating signals, said first two oscillating signals being in phase opposition to each other and in quadrature-phase with said second two oscillating signals, the device being characterised in that it comprises first generator electronic means apt to detect first instants of passage through a first reference value of each one of said first oscillating signals and to generate first power supply pulses for said second resonant electronic means in second instants, and in that it comprises second generator electronic means apt to detect third instants of passage through a second reference value of each one of said second oscillating signals and to generate second power supply pulses for said first resonant electronic means in fourth instants.

Always according to the invention, said first reference value may be equal to said second reference value.

Still according to the invention, said first reference value may be equal to the mean value of said first oscillating signals.

Furthermore according to the invention, said second reference value may be equal to the mean value of said second oscillating signals.

Always according to the invention, said first power supply pulses may be current pulses.

Still according to the invention, said second power supply pulses may be current pulses.

Furthermore according to the invention, said second instants may substantially coincide with said first instants.

Always according to the invention, said fourth instants may substantially coincide with said third instants.

Still according to the invention, said second instants may be the instants at which the projection of a vector representative of a power supply pulsed signal comprising said first power supply pulses on the first Floquet eigenvector of the state variables of said second resonant electronic means is not larger than a first value of maximum threshold, preferably equal to zero.

Furthermore according to the invention, said second instants may be the instants at which the projection of a vector representative of a power supply pulsed signal comprising said first power supply pulses on the first Floquet eigenvector of the state variables of said second differential oscillator as a whole is not larger than a first value of maximum threshold, preferably equal to zero.

Always according to the invention, said fourth instants may be the instants at which the projection of a vector representative of a power supply pulsed signal comprising said second power supply pulses on the first Floquet eigenvector of the state variables of said first resonant electronic means is not larger than a second value of maximum threshold, preferably equal to zero.

Still according to the invention, said fourth instants may be the instants at which the projection of a vector representative of a power supply pulsed signal comprising said second power supply pulses on the first Floquet eigenvector of the state variables of said first differential oscillator as a whole is not larger than a second value of maximum threshold, preferably equal to zero.

Furthermore according to the invention, said first resonant electronic means may comprise a first parallel resonant circuit, comprising a first inductor connected in parallel to a series of two first capacitors, between which the circuit ground is preferably connected, two ends of the first inductor being the first two terminals.

Always according to the invention, said second resonant electronic means may comprise a second parallel resonant circuit, comprising a second inductor connected in parallel to a series of two second capacitors, between which the circuit ground is preferably connected, two ends of the second inductor being the second two terminals.

Still according to the invention, the first and second generator electronic means may comprise MOS, preferably CMOS, technology components.

Furthermore according to the invention, each one of the two ends of the first inductor may be connected to the circuit ground through a respective series branch of three n-type MOS transistors and to a power supply voltage through a respective series branch of three p-type MOS transistors, the gate terminals of two MOS transistors of each series branch being connected to the two second terminals, the gate terminal of the remaining MOS transistor of each one of said series branches being connected to the end of the first inductor that is not connected to the respective series branch, and each one of the two ends of the second inductor may be connected to the circuit ground through a respective series branch of three n-type MOS transistors and to the power supply voltage through a respective series branch of three p-type MOS transistors, the gate terminals of two MOS transistors of each series branch being connected to the first two terminals, the gate terminal of the remaining MOS transistor of each one of said series branches being connected to the end of the second inductor that is not connected to the respective series branch.

Always according to the invention, in each one of the series branches connecting the two ends of the first inductor to the circuit ground and to the power supply voltage, the two MOS transistors the gate terminals of which are connected to the two second terminals may have the substrate wells, or bodies, to which four respective first body voltages are applied, so as to anticipate or delay the fourth instants with respect to the instant of passage through the mean value of the second oscillating signals, and, in each one of the series branches connecting the two ends of the second inductor to the circuit ground and to the power supply voltage, the two MOS transistors the gate terminals of which are connected to the first two terminals have the bodies to which four respective second body voltages are applied, so as to anticipate or delay the second instants with respect to the instant of passage through the mean value of the first oscillating signals.

Still according to the invention, the first four body voltages may be respectively equal to the second four body voltages.

The present invention will now be described, by way of illustration and not by way of limitation, according to its preferred embodiments, by particularly referring to the Figures of the enclosed drawings, in which.

In the Figures, alike elements are indicated by same reference numbers.

The inventors have developed a circuit architecture having two differential oscillators coupled to and in quadrature with one another each one of which is based on a structure with parallel resonator power supplied through current pulses. Current pulses are generated upon detection of the passage of the oscillating signal generated by the respective resonator through zero, when reference is made to the differential signal, or through the mean value, when reference is made to the single-ended signal.

In each of such structures, it would be necessary to apply pulses with a delay of ¼ of period with respect to the generation instant. The inventors have instead developed a circuit architecture that allows to avoid the introduction of this delay.

Figure 2:
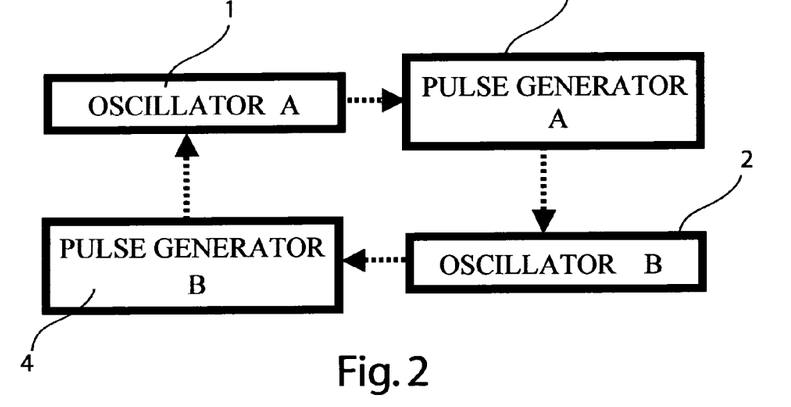
FIG. 2 schematically shows the circuit architecture of a first preferred embodiment of the device according to the invention.

In fact, with reference to FIG. 2, the circuit architecture of a first preferred embodiment of the device according to the invention comprises two coupled oscillators 1 and 2; the oscillating signal generated by the resonator (preferably comprising a parallel LC circuit) of each one of the two oscillators 1 and 2 is read by a respective pulse generation unit 3 and 4, that detects the instants of passage of the oscillating signal through zero (or through the mean value) and generates, in correspondence with such instants, current pulses which are applied to the other oscillator.

Figure 3:
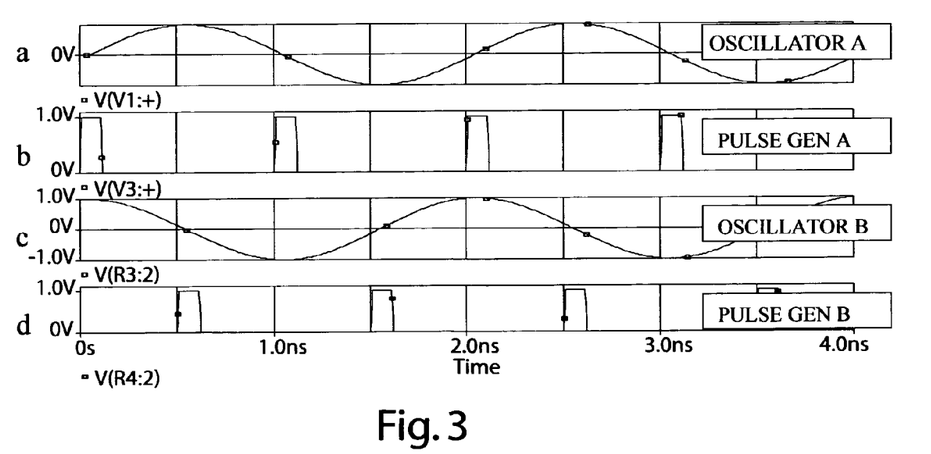
FIG. 3 shows time graphs of some signals present in the device of FIG. 2.

More in particular, FIG. 3 schematically shows the waveforms of the two oscillators 1 and 2 and of the power supply pulses generated by the units 3 and 4. Starting from the first oscillator 1, in correspondence with the passage through zero of its oscillating output signal, shown in FIG. 3a, the generation unit 3 generates the pulses, shown in FIG. 3b. Such pulses are applied as power supply current pulses to the second oscillator 2, which tends, for the locking mechanism described by Behzad Razavi in "*A Study of Injection Locking and Pulling in Oscillators*", IEEE Journal of Solid-State Circuits, Vol. 39, No. 9, pp. 1415-1424, September 2004, to position in time maxima of its sinusoidal output signal, shown in FIG. 3c, in correspondence with the power supply pulses. Similarly, in correspondence with the passage through zero of the oscillating output signal of the second oscillator 2, the generation unit 4 generates the pulses, shown in FIG. 3d. Such pulses, which are in correspondence with the maxima and minima of the oscillating output signal of the first oscillator 1, and hence adapted to its pulsed power supply, are applied as power supply current pulses to the first oscillator 1.

Such circuit architecture of the first preferred embodiment of the device according to the invention assumes that the resonant circuits of the oscillators 1 and 2 are ideal, whereby instants of application effectively correspond to maximum and minimum of the voltage across the resonant circuit. Differently, as described by Applications No. RM2004A000648 and No WO2006/070427, in non-ideality conditions, circuits forming the oscillator may present significant non-linearities in transistor capacitances and/or transconductances. In this case, in order to reduce the phase noise, instant of application of the pulses must be suitably delayed, choosing the instant at which the projection of the state variable "voltage of capacitor C" on the first Floquet eigenvector of the state variables of the circuit as a whole is minimum, preferably null, according to the deviation from orthogonality of the two main eigenvectors.

The circuit architecture of a second preferred embodiment of the device according to the invention takes also account of the non-ideality of the resonant circuits by introducing a proper variation of the threshold of power up of the pulses that consequently varies the instant of generation with respect to the passage of the oscillating voltage of the resonant circuits through zero (or through its mean value).

In the following the preferred embodiments of the device according to the invention implemented with MOS, preferably CMOS, technology are described. However, it must be intended that the device according to the invention may be also implemented with other electronic technologies, still remaining within the scope of the present invention.

Charging a capacitor, if this is made through a resistive element, produces a jitter (i.e. random time displacement of the occurrence of an event) due to the noise present in the component. In this regard, a MOS transistor must also be considered as resistive.

More in detail, when charging a capacitor $C_{GS}$ up to the threshold voltage, $\Delta V$, in a CMOS structure, the stored charge is, assuming a constant value I of the current i, $$\Delta Q = \int i \, dt = \Delta V C = I \Delta T$$

The introduced noise is random. By assuming, for the sake of simplicity, the typical dependency on the current i of the bipolar junction transistor BJT, it is equal to $$\sigma_q^2 = 2q \int i \, dt = 2q \Delta Q$$

that produces a voltage variation equal to $$\sigma_V^2 = \frac{\sigma_q^2}{C^2}$$

and, consequently, a time jitter equal to $$\sigma_t^2 = \frac{\sigma_V^2}{\left(\frac{\Delta V}{\Delta t}\right)^2} = \frac{\sigma_V^2}{\left(\frac{I}{C}\right)^2} = \frac{\sigma_q^2}{C^2}\left(\frac{C}{I}\right)^2 = \frac{\sigma_q^2}{I^2}$$

Therefore, the pulses are preferably directly generated starting from the resonant circuit so that energy is supplied by the inductance discharge. To this end, pulse construction is made starting from the voltages across the two resonant circuits of the oscillators 1 and 2 of FIG. 2, which, since the two oscillators are in quadrature, are four sinusoidal voltages, phase shifted with respect to each other at ranges of $\pi/2$.

Figure 4:
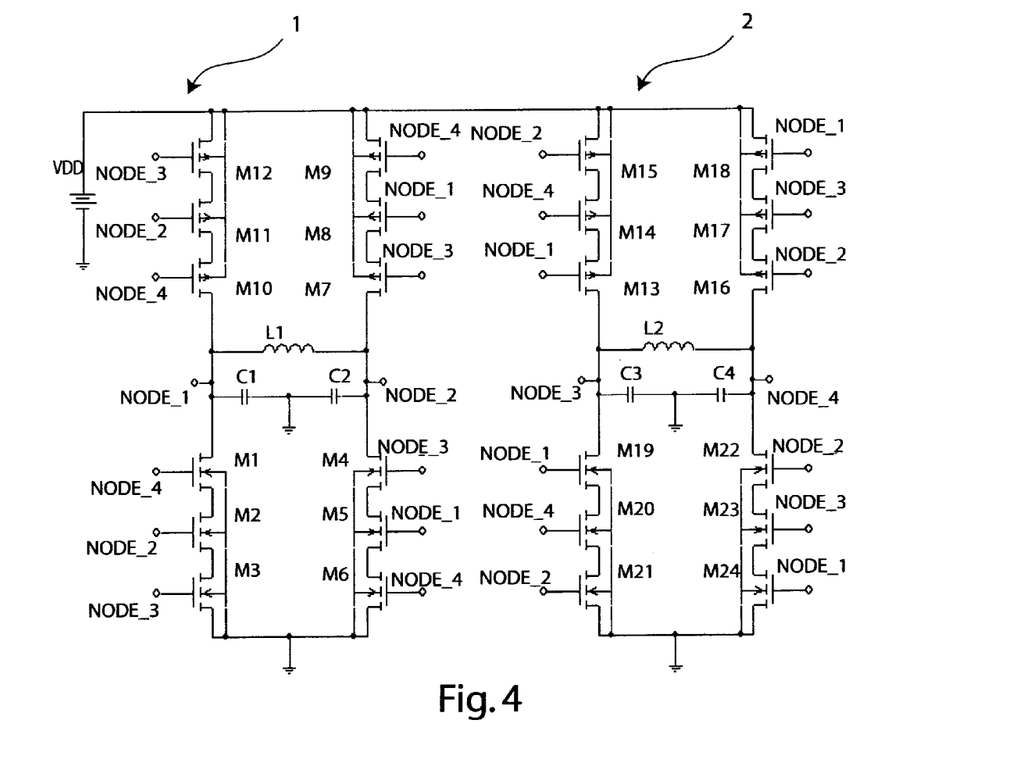
FIG. 4 shows the first embodiment of the device according to the invention.

With reference to FIG. 4, the first preferred embodiment of the device according to the invention may be schematically observed, which has two oscillators 1 and 2 made according to the same MOS circuit configuration and with the same circuit components.

In particular, each one of the two oscillators of FIG. 4 is provided with a resonant circuit comprising an inductor, respectively L1 for the first oscillator 1 and L2 for the second oscillator 2, connected in parallel to a series of two capacitors, respectively C1 and C2 for the first oscillator 1 and C3 and C4 for the second oscillator 2, between which the circuit ground is connected. The oscillating output signal of the respective oscillator is taken across the inductor: $V_{OUT\_1} = V_{NODE\_1} - V_{NODE\_2}$ generated by the first oscillator 1 and $V_{OUT\_2} = V_{NODE\_3} - V_{NODE\_4}$ generated by the second oscillator 2. As it will be better described below, the voltages $V_{NODE\_1}$ and $V_{NODE\_2}$ across NODE_1 and NODE_2 of the resonant circuit of the first oscillator 1 are in phase opposition with respect to each other, and they are in quadrature phase with the voltages $V_{NODE\_3}$ and $V_{NODE\_4}$ across NODE_3 and NODE_4 of the second oscillator 2, in turn in phase opposition with respect to each other.

The end of each one of the two resonant circuits is connected, according to a differential configuration, to the power supply voltage $V_{DD}$ and to the circuit ground through series branches of three MOS transistors. In particular, node NODE_1 is connected to the drain terminal of a first n-type MOS transistor M1, the source terminal of which is connected to the drain terminal of a second n-type MOS transistor M2, the source terminal of which is connected to the drain terminal of a third n-type MOS transistor M3, the source terminal of which is connected to the circuit ground. Moreover, node NODE_1 is connected to the drain terminal of a first p-type MOS transistor M10, the source terminal of which is connected to the drain terminal of a second p-type MOS transistor M11, the source terminal of which is connected to the drain terminal of a third p-type MOS transistor M12, the source terminal of which is connected to the power supply voltage $V_{DD}$.

Similarly, node NODE_2 is connected to the circuit ground through a series branch of three n-type MOS transistors M4, M5, and M6, and to the power supply voltage $V_{DD}$ through a series branch of three p-type MOS transistors M7, M8, and M9.

The second oscillator 2 has the same circuit configuration, so that each one of nodes NODE_3 and NODE_4 of the resonant circuit is connected to the circuit ground and to the power supply voltage $V_{DD}$ through corresponding series of three MOS transistors respectively of n-type and of p-type: namely, the NMOS transistors M19, M20, and M21 and the PMOS transistors M13, M14, and M15 for node NODE_3, and the NMOS transistors M22, M23, and M24 and the PMOS transistors M16, M17, and M18 for node NODE_4.

In particular, it is important to point out that the MOS transistors which are connected in series across the resonant circuit of the second oscillator 2 correspond to the pulse generation unit 3 shown in FIG. 2, while the MOS transistors which are connected in series across the resonant circuit of the first oscillator 1 correspond to the pulse generation unit 4 shown in FIG. 2.

The gate terminals of two MOS transistors of each one of the four series branches included in each oscillator are connected to the two nodes of the resonant circuit of the other oscillator: e.g., for the first oscillator 1, the gate terminals of two MOS transistors of each one of the four series branches are connected to the nodes NODE_3 and NODE_4 of the second oscillator 2.

Moreover, the gate terminal of the remaining MOS transistor of each one of such four series branches is connected to the node of the resonant circuit of the same oscillator (to which the related series branch belongs) which is not connected to the series branch: e.g., in the two series branches of the first oscillator 1 which are connected to node NODE_1, the remaining transistor MOS is connected to node NODE_2. In particular, for reason of efficiency in pulse formation, such remaining MOS transistors are preferably the central transistors of the respective series branches.

The details of such connections among nodes of the resonant circuits and gate terminals of the MOS transistors is immediately evident from FIG. 4 for a person skilled in the art.

Figure 5:
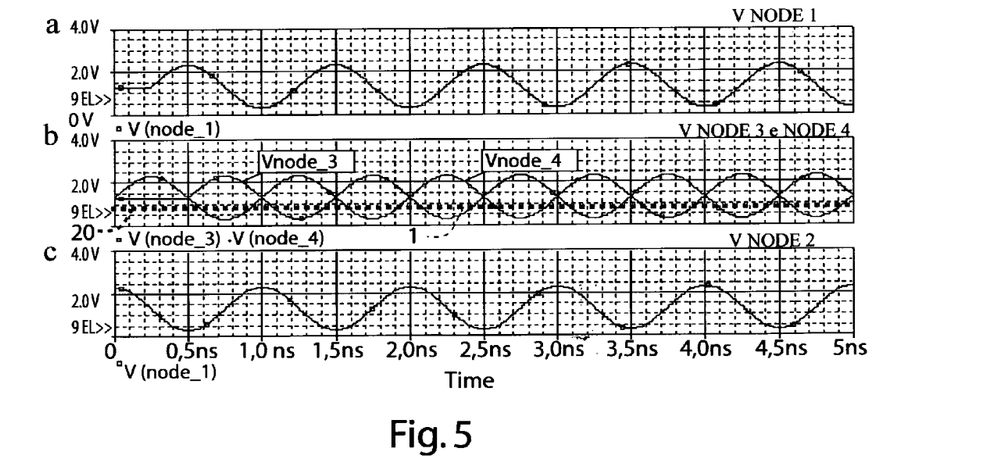
FIG. 5 shows time graphs of some first signals present in the device of FIG. 4.

Thanks to the illustrated connections of the gate terminals of the MOS transistors to the nodes of the resonant circuits, these are correctly power supplied in differential way, alternatively, through current pulses, as it is easily comprehensible by examining FIG. 5 where sinusoidal voltages $V_{NODE\_1}$ (FIG. 5a), $V_{NODE\_2}$ (FIG. 5c), $V_{NODE\_3}$ and $V_{NODE\_4}$ (FIG. 5b) present on nodes NODE_1, NODE_2, NODE_3 and NODE_4 are shown.

In fact, considering node NODE_1 of the first oscillator 1, this must be connected to the circuit ground when the voltage oscillating signal $V_{NODE\_1}$ thereon assumes its minimum value. In particular, the signal $V_{NODE\_1}$ is in quadrature phase with the signals $V_{NODE\_3}$ and $V_{NODE\_4}$. FIG. 5 shows that, in correspondence with minima of the voltage $V_{NODE\_1}$ on node NODE_1, the voltages $V_{NODE\_3}$ and $V_{NODE\_4}$ across the resonant circuit of the second oscillator 2, which are in quadrature phase, present a crossing, whereby when one increases the other decreases. This effect is used by the device developed by the inventors for making a current pulse (that is negative, i.e. directed from node NODE_1 to the circuit ground) through the operation of logic AND on the analog signals $V_{NODE\_3}$ and $V_{NODE\_4}$ made by the two NMOS transistors M3 and M1 in series: when both the voltage at the gate of M3 and the voltage at the gate of M1 (logic AND) are high, hence over the threshold (schematically indicated in FIG. 5b by the dashed line 20) the two transistors M3 and M1 simultaneously conduct and draw current from capacitor C1. In this regard, the threshold voltage $V_{Tn}$ of the NMOS transistors must be lower than the mean value of the oscillating voltages applied on the related gate terminals.

In the next half cycle, when the voltage $V_{NODE\_1}$ on node NODE_1 is at maximum, node NODE_1 must be connected to the power supply voltage $V_{DD}$ for supplying energy to capacitor C1 through a current pulse. This only occurs if the gate voltages of the two PMOS transistors M10 and M12 are simultaneously (logic AND) below the power up threshold voltage. The voltages $V_{NODE\_3}$ and $V_{NODE\_4}$ on nodes NODE_3 and NODE_4 of the second oscillator 2, in correspondence with the maximum of the voltage $V_{NODE\_1}$, cross each other, and the operation of logic AND on the analog signals $V_{NODE\_3}$ and $V_{NODE\_4}$ made by the two PMOS transistors M12 and M10 generates a current pulse (that is positive, i.e. directed from the power supply voltage $V_{DD}$ to node NODE_1). In this case, it must be noted that that the voltage applied to the gates making the transistors turn on is equal to the power supply voltage, $V_{DD}$, minus the threshold voltage of the PMOS transistors, $V_{Tp}$. In order that the two transistors are simultaneously turned on, and the pulse forms, it is necessary that said power up voltage is over the mean value.

Crossing between the voltages $V_{NODE\_3}$ and $V_{NODE\_4}$ on nodes NODE_3 and NODE_4 occur twice per period of the voltage $V_{NODE\_1}$, namely in correspondence with the maximum and the minimum of the voltage $V_{NODE\_1}$ on node NODE_1. However, the negative current pulse and the positive current pulse must be applied to node NODE_1 only once per period: respectively in correspondence with the minimum of the voltage $V_{NODE\_1}$ through the series of transistors NMOS, and in correspondence with the maximum of the voltage $V_{NODE\_1}$ through the series of transistors PMOS.

The third transistor present in the series branches of the device of FIG. 4, which in the two exemplarily examined series branches are M2 in the series of NMOS transistors and M11 in the series of PMOS transistors, allows inhibition of pulse generation in correspondence with non-correct instants.

Turning to consider node NODE_1 again, the NMOS transistor M2, the gate terminal of which is connected to the voltage $V_{NODE\_2}$ on node NODE_2, which is in phase opposition to the voltage $V_{NODE\_1}$, inhibits the generation of a negative pulse in correspondence with the maximum of the voltage $V_{NODE\_1}$ (corresponding to the minimum of the voltage $V_{NODE\_2}$), while the PMOS transistor M11, the gate terminal of which is also connected to the voltage $V_{NODE\_2}$, inhibits the generation of a positive pulse in correspondence with the minimum of the voltage $V_{NODE\_1}$ (corresponding to the maximum of the voltage $V_{NODE\_2}$).

In other words, the inhibition of one of the two pulses, which would be applied, on both the series branches of NMOS and PMOS transistors, to each node of the resonant circuits of the device of FIG. 4 (e.g. to node NODE_1) for each period of the voltage present on the same node (e.g. the voltage $V_{NODE\_1}$), is carried out by adding according to a logic AND the voltage on the other node of the same resonant circuit to which the node under consideration belongs (e.g. the voltage $V_{NODE\_2}$ on node NODE_2), which is in phase opposition to the voltage on the node (e.g. the voltage $V_{NODE\_1}$ on node NODE_1) that has to be power supplied.

In fact, turning to consider node NODE_1 again, with the addition of the NMOS transistor M2 to the series of the NMOS transistors, the gate of which is connected to the node NODE_2, the negative current pulse through the series of NMOS transistors occurs only when the voltage $V_{NODE\_2}$ on node NODE_2 is high. Similarly, the addition of the PMOS transistor M11 to the series of the PMOS transistors, the gate of which is still connected to NODE_2, causes the positive current pulse through the series of PMOS transistors to occur only when the voltage $V_{NODE\_2}$ on node NODE_2 is low.

Figure 6:
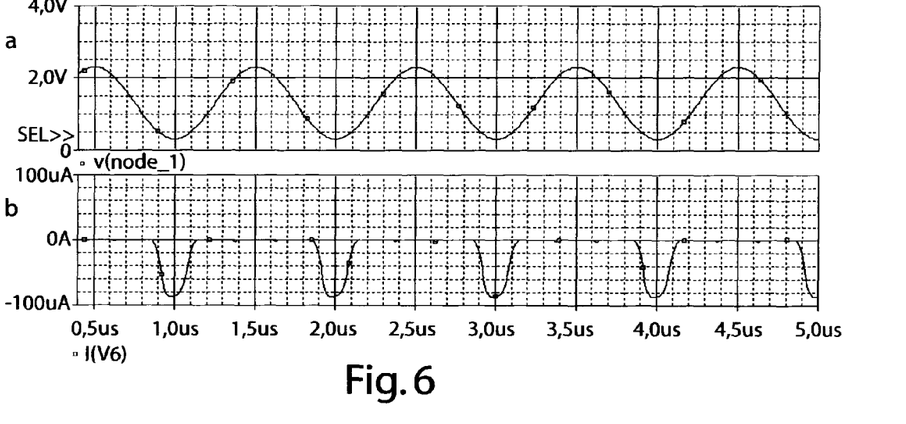
FIG. 6 shows time graphs of some second signals present in the device of FIG. 4.

FIG. 6a schematically shows a simulation of the voltage $V_{NODE\_1}$ on node NODE_1 (assuming an oscillation amplitude of about 2 Volts) and FIG. 6b schematically shows a simulation (assuming a voltage $V_{Tn}$ of threshold of turning on of the NMOS transistors equal to about 0.7 Volt) of the negative current pulses generated by the series of the NMOS transistors M1, M2 and M3, starting from the oscillation sinusoidal voltages $V_{NODE\_2}$, $V_{NODE\_3}$ and $V_{NODE\_4}$ on nodes NODE_2, NODE_3 and NODE_4, which pulses are applied on node NODE_1.

The same circuit diagram, by suitably permuting node connections as show in FIG. 4, is repeated for power supply to the other terminals NODE_2, NODE_3, and NODE_4 of the resonant circuits.

Figure 7:
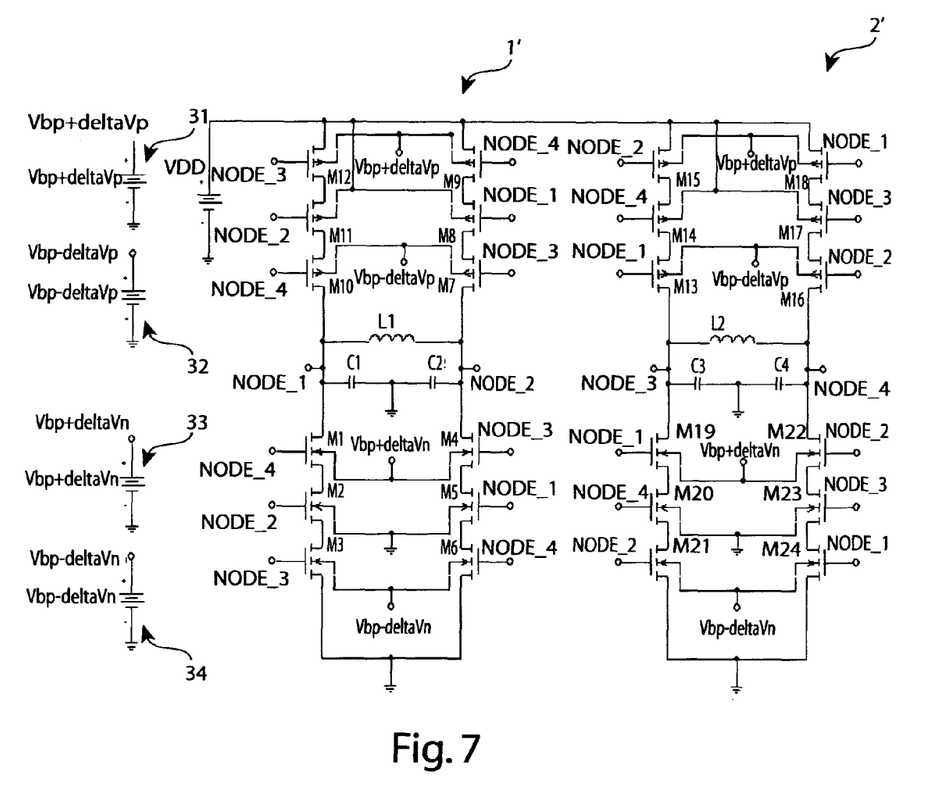
FIG. 7 shows a second embodiment of the device according to the invention.

With reference to FIG. 7, it may be schematically observed that the second preferred embodiment of the device according to the invention that also takes account of the non-ideality of the resonant circuits of the oscillators. As previously mentioned, in order to reduce the phase noise, pulsed power supply current must be suitably applied at an instant at which the projection of the state variable "voltage of capacitor C" on the first Floquet eigenvector of the state variables of the system as a whole is minimum, preferably null, according to the deviation from orthogonality of the two main eigenvectors. In case of real resonator circuits, this instant does not generally coincides with the maximum nor with the minimum of the resonator oscillation voltage, and the pulsed power supply current must be applied at a different instant, which is either in advance or delayed, with respect to the instants of maximum or minimum of such oscillation voltage. The device of FIG. 7 introduces such advance or delay through a proper variation of the threshold of power up of the pulses.

In particular, the device of FIG. 7 also comprises two oscillators 1' and 2' implemented according to the same circuit configuration of the device of FIG. 4, provided with parallel resonant circuits LC the ends of which are connected to the circuit ground and to the power supply voltage $V_{DD}$ through series branches of three NMOS and PMOS, respectively, transistors. Also the gate terminals of the MOS transistors are connected to nodes NODE_1, NODE_2, NODE_3, and NODE_4 of the resonant circuits in the same way as the device of FIG. 4.

In order to get an advance or a delay in the generation of the current pulses applied across the resonant circuits, the device of FIG. 7 introduces a variation of the threshold of power up of the same pulses with respect to the threshold values ($V_{Tn}$ for the NMOS transistors and ($V_{DD}$−$V_{Tp}$) for the PMOS transistors) previously fixed for obtaining pulses centred with respect to maxima and minima. To this end, the threshold of each transistor MOS is modified by applying a voltage to the substrate well, usually called body, of the same transistor. Preferably, using a suitable implementing technology, the body electrode of each transistor is rendered independent from the others. It is important to note that in the device of FIG. 7 the pulses are not delayed with respect to the passage through the threshold (since this would introduce jitter), rather the threshold is moved so that both passage through the threshold and pulse generation are delayed with respect to the passage through zero by the differential signal (or through the mean value by the single ended signals).

The device of FIG. 7 further comprises four dc voltage generators: the generator 31, the voltage of which is equal to (Vbp+deltaVp), that is connected to the body electrodes of the PMOS transistors M9, M12, M15 and M18; the generator 32, the voltage of which is equal to a (Vbp−deltaVp), that is connected to the body electrodes of the PMOS transistors M7, M10, M13 and M16; the generator 33, the voltage of which is equal to (Vbn+deltaVn), that is connected to the body electrodes of the NMOS transistors M1, M4, M19 and M22; and the generator 34, the voltage of which is equal to (Vbn−deltaVn), that is connected to the body electrodes of the NMOS transistors M3, M6, M21 and M24.

Considering the circuit configuration of the first oscillator 1', the dc voltages applied to the body electrodes of the transistors M1, M3, M4 and M6 are chosen in the following manner.

The value Vbn is equal to a value suitably chosen so as to determine the length of the negative pulses to generate in correspondence with the passage though zero of the differential voltages of the oscillators, $V_{OUT\_1}$, $V_{OUT\_2}$.

The value deltaVn is subtracted from Vbn so as to provide the voltage for the body electrodes of the NMOS transistors M3 and M6, and it is added to Vbn so as to provide the voltage for the body electrodes of the NMOS transistors M1 and M4.

Assuming that the value deltaVn is positive, the lowest voltage, equal to (Vbn−deltaVn), applied to the body electrodes of the NMOS transistors M3 and M6, determines a threshold voltage of such two transistors which is higher than the one that is fixed in the transistors M1 and M4, to the body electrodes of which a higher dc voltage, equal to (Vbn+deltaVn), is applied.

Due to these modifications of the threshold voltage of the NMOS transistors, the sinusoidal voltage $V_{NODE\_4}$ on node NODE_4, on its rising edge, exceeding the (lower) threshold of the NMOS transistor M1 in advance (with respect to the passage through zero of the sinusoidal voltage $V_{NODE\_4}$), will cause the power up in advance of the negative current pulse applied to node NODE_1. In turn, the sinusoidal voltage $V_{NODE\_3}$ on node NODE_3, on its falling edge, will fall below the (higher) threshold of the NMOS transistor M3 also in advance and will cause the power down, in advance, of the same negative current pulse. In the case when it is necessary to introduce a delay, instead of an advance, in the pulse generation, voltage variation deltaVn will have a negative value.

Similarly, in the next half cycle, the positive current pulses generated by the PMOS transistors may be suitably phase shifted, anticipated or delayed.

In fact, the dc voltages applied to the body electrodes of the PMOS transistors M7, M9, M10 and M12 are chosen in the following manner.

The value Vbp is equal to a value suitably chosen so as to determine the length of the negative pulses to generate in correspondence with the passage through zero of the differential voltage $V_{OUT\_2} = V_{NODE\_3} - V_{NODE\_4}$ of the second oscillator 2'.

The value deltaVp is added to Vbp so as to provide the voltage for the body electrodes of the PMOS transistors M12 and M9, and it is subtracted from Vbp so as to provide the voltage for the body electrodes of the PMOS transistors M7 and M10.

Assuming that the value deltaVp is positive, the highest voltage, equal to (Vbp+deltaVp), applied to the body electrodes of the PMOS transistors M9 and M12, determines a threshold voltage of such two transistors which is lower than the one that is fixed in the PMOS transistors M10 and M7, to the body electrodes of which a lower dc voltage, equal to (Vbp−deltaVp), is applied.

Due to these modifications of the threshold voltage, the sinusoidal voltage $V_{NODE\_4}$ on node NODE_4, on its falling edge, falling below the (higher) threshold of the PMOS transistor M10 in advance (with respect to the passage through zero of the sinusoidal voltage $V_{NODE\_4}$), will cause the power up in advance of the positive current pulse applied to node NODE_1. In turn, the sinusoidal voltage $V_{NODE\_3}$ on node NODE_3, during its rising edge, will exceed the (lower) threshold of the PMOS transistor M12 also in advance and will cause the power down, in advance, of the same positive current pulse. Also in this case, if it is necessary to introduce a delay, instead of an advance, in the pulse generation, the voltage variation deltaVp will have a negative value.

The same circuit diagram, by suitably permuting the connections of nodes as shown in FIG. 7, is repeated for power supply to the other terminals NODE_2, NODE_3, and NODE_4 of the resonant circuits.

In this regard, other embodiments of the device according to the invention may provide that the voltages applied to the bulk electrodes of the MOS transistors of the two oscillators 1' and 2' are different from each, so as to adjust the time displacement of the power supply pulses according to the specific non-idealities of each one of the two resonant circuits.

Furthermore, other embodiments of the device according to the invention may provide resonant circuits different from the resonant circuits shown in the enclosed Figures, and possibly different for the two oscillators. In this case, the pulsed power supply could be also provided through voltage, instead of current, pulses or even with a combination of voltage and current pulses. Consequently, the pulse generation units can also generate the pulses in instants different from the passage through zero (or through the mean value) of the oscillating signals generated across the resonant circuits, e.g. in correspondence with maxima or minima of such oscillating signals.

The present invention has been described, by way of illustration and not by way of limitation, according its preferred embodiment, but it should be understood that those skilled in the art can make variations and/or changes, without so departing from the related scope of protection, as defined by the enclosed claims.

The invention claimed is:

1. A device having a first and a second differential oscillators coupled to and in quadrature-phase with each other, comprising first and second resonant electronic means respectively, which are configured to provide, respectively on first two and second two terminals, first two and second two oscillating signals, said first two oscillating signals being in phase opposition to each other and in quadrature-phase with said second two oscillating signals, wherein the device comprises first generator electronic means configured to detect first instants of passage through a first reference value of each one of said first oscillating signals and to generate first power supply pulses for said second resonant electronic means in second instants, and in that it comprises second generator electronic means configured to detect third instants of passage through a second reference value of each one of said second oscillating signals and to generate second power supply pulses for said first resonant electronic means in fourth instants, wherein said second instants are the instants at which the projection of a vector representative of a power supply pulsed signal comprising said first power supply pulses on the first Floquet eigenvector of state variables selected from the group comprising the state variables of said second resonant electronic means and the state variables of said second differential oscillator as a whole is not larger than a first value of maximum threshold and wherein said fourth instants are the instants at which the projection of a vector representative of a power supply pulsed signal comprising said second power supply pulses on the first Floquet eigenvector of state variables selected from the group comprising the state variables of said first resonant electronic means and the state variables of said first differential oscillator as a whole is not larger than a second value of maximum threshold.

2. A device according to claim 1, wherein said first reference value is equal to said second reference value.

3. A device according to claim 1, wherein said first reference value is equal to the mean value of said first oscillating signals.

4. A device according to claim 1, wherein said second reference value is equal to the mean value of said second oscillating signals.

5. A device according to claim 1, wherein said first power supply pulses are current pulses.

6. A device according to claim 1, wherein said second power supply pulses are current pulses.

7. A device according to claim 1, wherein said second instants substantially coincide with said first instants.

8. A device according to claim 1, wherein said fourth instants substantially coincide with said third instants.

9. A device according to claim 1, wherein said first resonant electronic means comprises a first parallel resonant circuit, comprising a first inductor connected in parallel to a series of two first capacitors, two ends of the first inductor being the first two terminals.

10. A device according to claim 1, wherein said second resonant electronic means comprises a second parallel resonant circuit, comprising a second inductor connected in parallel to a series of two second capacitors, two ends of the second inductor being the second two terminals.

11. A device according to claim 1, wherein the first and second generator electronic means comprise MOS technology components.

12. A device according to claim 3, wherein said second reference value is equal to the mean value of said second oscillating signals, and wherein said first power supply pulses are current pulses and said second power supply pulses are current pulses, said first resonant electronic means comprising a first parallel resonant circuit, comprising a first inductor connected in parallel to a series of two first capacitors, two ends of the first inductor being the first two terminals, said second resonant electronic means comprising a second parallel resonant circuit, comprising a second inductor connected in parallel to a series of two second capacitors, two ends of the second inductor being the second two terminals, the first and second generator electronic means comprising MOS technology components, wherein each one of the two ends of the first inductor is connected to a circuit ground through a respective series branch of three n-type MOS transistors and to a power supply voltage through a respective series branch of three p-type MOS transistors, the gate terminals of two MOS transistors of each series branch being connected to the two second terminals, the gate terminal of the remaining MOS transistor of each one of said series branches being connected to the end of the first inductor that is not connected to the respective series branch, the device being further characterised in that each one of the two ends of the second inductor is connected to the circuit ground through a respective series branch of three n-type MOS transistors and to the power supply voltage through a respective series branch of three p-type MOS transistors, the gate terminals of two MOS transistors of each series branch being connected to the first two terminals, the gate terminal of the remaining MOS transistor of each one of said series branches being connected to the end of the second inductor that is not connected to the respective series branch.

13. A device according to claim 12, wherein, in each one of the series branches connecting the two ends of the first inductor to the circuit ground and to the power supply voltage, the two MOS transistors the gate terminals of which are connected to the two second terminals have the substrate wells, or bodies, to which four respective first body voltages are applied, so as to anticipate or delay the fourth instants with respect to the instant of passage through the mean value of the second oscillating signals, the device being further characterised in that, in each one of the series branches connecting the two ends of the second inductor to the circuit ground and to the power supply voltage, the two MOS transistors the gate terminals of which are connected to the first two terminals have the bodies to which four respective second body voltages are applied, so as to anticipate or delay the second instants with respect to the instant of passage through the mean value of the first oscillating signals.

14. A device according to claim 13, characterised in that the first four body voltages are respectively equal to the second four body voltages.

15. A device according to claim 1, wherein said first value of maximum threshold is equal to zero.

16. A device according to claim 1, wherein said second value of maximum threshold is equal to zero.

17. A device according to claim 12, wherein said first and second generator electronic means comprises CMOS technology components.

18. A device according to claim 9, wherein a circuit ground is connected between the series of two first capacitors.

19. A device according to claim 10, wherein a circuit ground is connected between the series of two second capacitors.

20. A device according to claim 11, wherein said first and second generator electronic means comprise CMOS technology components.

21. A device according to claim 12, wherein said circuit ground is connected between the series of the two first capacitors.

22. A device according to claim 12, wherein said circuit ground is connected between the series of two second capacitors.

* * * * *